(12) United States Patent
Buj et al.

(10) Patent No.: US 6,433,416 B1
(45) Date of Patent: Aug. 13, 2002

(54) INTERCONNECTION FOR INTEGRATED HIGH VOLTAGE ELECTRONIC DEVICES

(75) Inventors: Christel Buj; Benoît Giffard, both of Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 09/743,148

(22) PCT Filed: Jul. 8, 1999

(86) PCT No.: PCT/FR99/01661

§ 371 (c)(1),
(2), (4) Date: Jan. 5, 2001

(87) PCT Pub. No.: WO00/03438

PCT Pub. Date: Jan. 20, 2000

(30) Foreign Application Priority Data

Jul. 9, 1998 (FR) .............................................. 98 08820

(51) Int. Cl.[7] .............................................. H01L 23/52

(52) U.S. Cl. ....................................... 257/691; 257/774
(58) Field of Search ................................. 257/758, 774, 257/691, 767, 775

(56) References Cited

U.S. PATENT DOCUMENTS

| | | | | |
|---|---|---|---|---|
| 5,101,261 A | * | 3/1992 | Maeda ......................... 257/68 |
| 5,288,948 A | * | 2/1994 | Fukuda et al. ............... 257/775 |
| 5,329,162 A | * | 7/1994 | Nadaoka ..................... 257/774 |
| 5,382,831 A | * | 1/1995 | Atakov et al. ............... 257/767 |
| 5,689,139 A | * | 11/1997 | Bui et al. ..................... 257/758 |

* cited by examiner

Primary Examiner—David Nelms
Assistant Examiner—Andy Huynh
(74) Attorney, Agent, or Firm—Hayes Soloway P.C.

(57) ABSTRACT

A device for the interconnection of at least two electronic elements separated by at least one buffer zone. The interconnection includes one or more interconnection tracks for the elements, which tracks are perforated at least in parts of the track or tracks situated above the buffer zones.

16 Claims, 2 Drawing Sheets

INTERCONNECTION FOR INTEGRATED HIGH VOLTAGE ELECTRONIC DEVICES

TECHNICAL FIELD OF PRIOR ART

The invention relates to the field of micro-electronics and that of power electronics; it also relates to the power function controlled by MOS Smart Power logic. It relates to and is also applicable to interconnections with intersecting high voltage and low voltage zones in integrated power devices or to the interconnections of devices passing above a lightly doped, active zone.

In integrated circuits for power electronics, interconnections are a problem that is difficult to solve. One of the problems resides in making high voltage metal tracks that pass over a low voltage active zone.

In silicon, the high and low voltage zones are separated by a lightly doped buffer zone in which the potential gradually varies from the high to the low voltage: this buffer zone may also be insulating. A metal track which passes above this buffer zone strongly interferes with it. The voltage of this buffer zone can fall from 650 V to 200 V.

Means currently used to counter this problem are:

very thick oxide on the silicon and under the metal to cause maximum separation of the metal track from the buffer zone ; for example, a separation of about 8 μm for a maintained voltage of 600 V, which is technologically difficult to create, the so-called "packaging" method which enables one to make connections using the package, the wires passing very far away from the buffer zone. This method is a non-integrated method.

DESCRIPTION OF THE INVENTION

The object of the invention is an interconnection device for at least two electronic elements, separated by at least one buffer zone, the interconnection comprising one or more interconnection tracks for the elements, the track being perforated at least in the parts of the track or tracks situated above or close to the buffer zones.

By electronic elements one understands any conductive or semi-conductive zone of an electronic circuit that can be interconnected. These zones may be, for example, zones of high or low voltage, connection contacts, etc. and the electronic circuits may be diodes, transistors etc.

Generally, the interconnection track or tracks (also called lines of interconnection) are separated from the one or more buffer zones by an insulating layer. Advantageously, this insulating layer is silicon oxide, notably for elements produced in silicon.

The creation of perforated tracks or interconnection lines, for example in the form of perforated metal layers, permits a clearly improved distribution of the potential, within the buffer zone. The maintained voltage of the buffer zone rises to about 500 V. The fact of using a perforated track or perforated interconnection lines enables field lines to leave the buffer zone through the holes made in the track or in the interconnection lines.

The track or the interconnection lines can be created in the form of a perforated metal layer, that is to say a metal layer with a large number of holes or slits. The holes can, for example, be in the form of a honeycomb.

BRIEF DESCRIPTION OF THE FIGURES

The features and advantages of the invention will better become apparent in the light of the description which follows. This description rests on embodiment examples given for explanatory purposes which are non-limitative and refer to the appended drawings in which.

DETAILED DESCRIPTION OF EMBODIMENTS OF THE INVENTION

Figure 1:
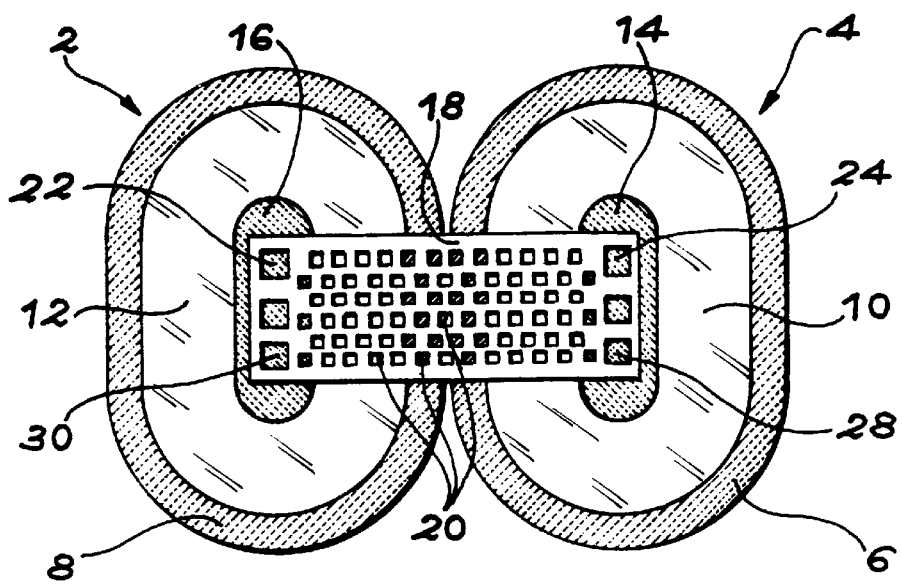
FIG. 1 is a view from above of an interconnection between two N/P diodes, according to the invention.
Figure 2A:
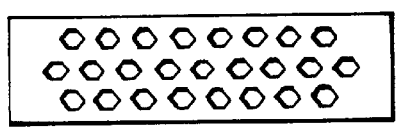
FIGS. 2A to 2E illustrate various embodiments of a perforated metal layer track.
Figure 2B:
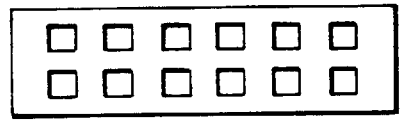
Figure 2C:
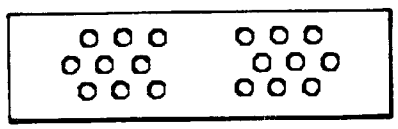
Figure 2D:
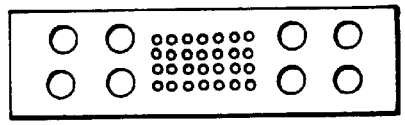
Figure 2E:
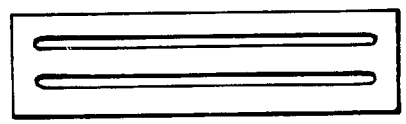

A first embodiment example of the invention is illustrated in FIG. 1, which represents an interconnection between two N/P diodes 2, 4.

Each diode comprises a low voltage zone 6, 8 (for example $P^+$ silicon), a buffer zone 10, 12 (for example slightly N doped silicon), a high voltage zone 14, 16 (for example $N^+$ silicon). An interconnection 18 is set up between the high voltage zones. By the expression "high voltage", one understands a voltage greater than or equal to a few tens of volts (for example: equal to or greater than 40 V).

This interconnection is created in the form of a metal track in which holes 20 have been made. The track is connected to each of the high voltage zones 14, 16 by $N^+$ connection contacts 22, 24, 28, 30.

As illustrated in FIGS. 2A to 2E, the perforated metal track comprises holes which may have various shapes and greater or smaller sizes, the distribution of which may not be uniform. The dimensions of the openings can, for example, vary, depending on the device, from 0.5 μm to 20 μm, and the space between openings may vary, for example, between 0.5 μm and a few tens of micrometers (for example: 30 μm or 50 μm).

Figure 3A:
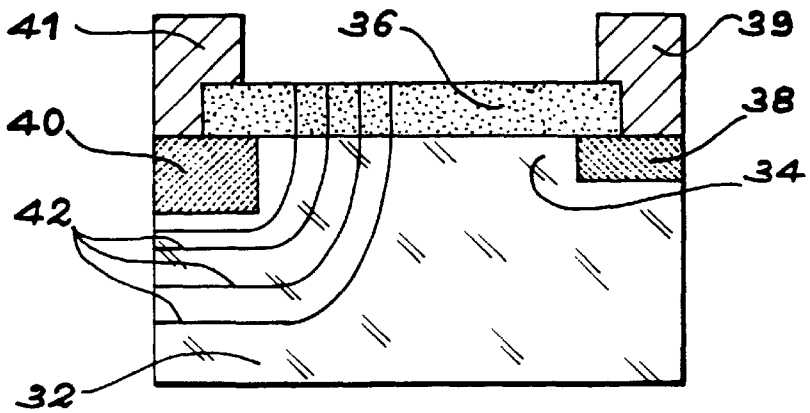
FIGS. 3A to 3C represent respectively a section view of a diode without a metal track on the buffer zone, with a metal track on th e buffer zone and with a perforated metal track on the buffer zone.
Figure 3B:
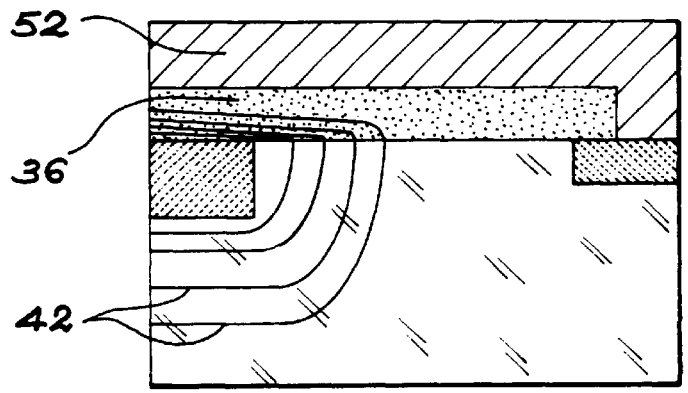
Figure 3C:
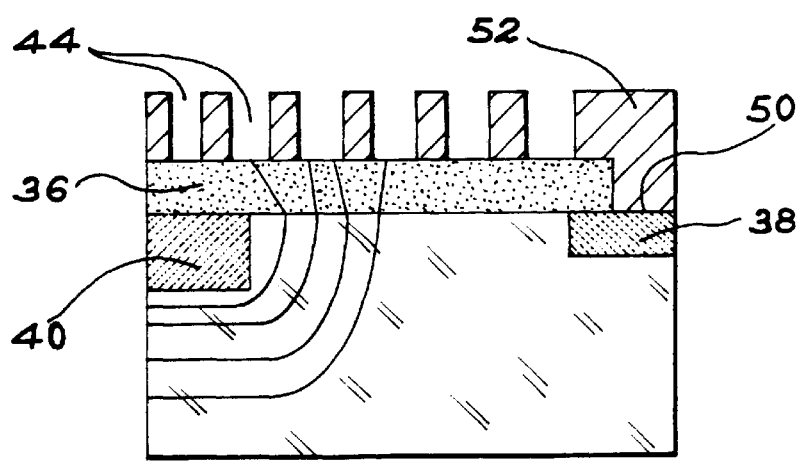

FIGS. 3A to 3C illustrate the particular case of a lateral P/N diode made in a slightly $N^-$ doped silicon substrate 32. Such a diode has an intrinsic maximum voltage of 650 V. This maximum value is obtained when there is no metal track on the active buffer zone 34 a slightly $N^-$ doped zone). No effect can then interfere with the field lines which can go out from the silicon through the surface oxide 36. In FIG. 3A, the metal contacts 39 and 41 correspond respectively to the connection points on the high and low voltage zones which are designated respectively by reference numbers 38 and 40. The field lines are also diagrammatically represented in this Figure (reference number 42).

If a metal track 52 is created on the oxide 36, and above the active buffer zone, in order to connect the high voltage zone 38 to another electronic element (FIG. 3B) the maintained voltage of the diode falls to about 200 V. The effect of the metal is strongly felt, since it imposes a potential (high voltage) on the surface of the oxide 36. The field lines 42 are curved when they come back into the oxide, and is unable to leave the oxide because of the potential imposed by the high voltage metal track 52. Therefore the field lines find themselves locked in the surface oxide: there may be heating and premature breakdown of the diode. It is possible to increase the thickness of oxide 36, in order to separate the metal from the buffer zone to the maximum extent; however, this solution is technologically very difficult to implement: in effect it would be necessary to have from about 6 to 8 μm of oxide to resolve the problem in this way.

In contrast to this, according to the invention, the metal layer is perforated (FIG. 3C) so that the field lines can leave the oxide. The voltage of the diode is then clearly improved since it goes back up to about 500 V. The holes in the metal layer may be of any shape (they may be square, round, hexagonal, octagonal or be in the form of slits, as illustrated in FIGS. 2A to 2E). Square shaped holes in the track may have, for example, 5 µm sides and be 5 µm spaced apart. The metal layer 52 is etched in such a way that openings 44 are caused to appear. In this etching step, current microelectronics technology can be used.

According to the invention, the oxide 36 under the metal then no longer has to be as thick in order to have the desired voltage maintenance behavior. The etching step and the creation of the metal track involve completely standard technology. In addition, metal tracks produced in this way permit interconnection of devices to one another in an integrated manner.

A method for the production of a device according to the invention can involve the following steps.

Starting with a substrate 32, a sacrificial oxidation is carried out and then high and low voltage zones are formed. To do this, a resin mask is produced by lithography and then boron is implanted to form the P$^+$ zone 40. The resin is then removed and a diffusion annealing of the boron is carried out.

Then a resin mask is produced by lithography and implantation of arsenic is carried out in order to form the N$^+$ zone 38. The used resin is then removed and an N$^+$ diffusion annealing is carried out.

The field oxide 36 is produced by thermal oxidation or by deposition. The oxide is etched to create the contact 50. Then a metal coating is carried out, for example with a metal based on aluminum, copper or any other conductive metal or any conductive metals used for superimposition in microelectronics. This metal layer is etched (dry etching) according to the pattern desired.

What is claimed is:

1. An interconnection device for at least two electronic elements, held at substantially equal potentials and separated by at least one buffer zone through which electrical field lines pass, said interconnection device comprising at least one conductive track for the interconnection of the elements, said conductive track being (1) electrically insulated from the buffer zone, (2) situated, at least in part, above the buffer zone, and (3) having openings which allow electrical field lines to leave the buffer zone.

2. An interconnection device according to claim 1, and further comprising an insulating layer separating the interconnection track from the buffer zone.

3. An interconnection device according to claim 2, wherein the insulating layer comprises a layer of silicon oxide.

4. An interconnection device according to claim 1, wherein the openings comprise holes in the shape of a honeycomb.

5. An interconnection device according to claim 2, wherein the openings comprise holes in the shape of a honeycomb.

6. An interconnection device according to claim 3, wherein the openings comprise holes in the shape of a honeycomb.

7. An interconnection device according to claim 1, wherein the openings comprise slits.

8. An interconnection device according to claim 2, wherein the openings comprise slits.

9. An interconnection device according to claim 3, wherein the openings comprise slits.

10. An interconnection device according to claim 1, wherein the openings comprise holes having a diameter, or a maximum size of between 0.5 µm and 20 µm.

11. An interconnection device according to claim 2, wherein the openings comprise holes having a diameter, or a maximum size of between 0.5 µm and 20 µm.

12. An interconnection device according to claim 3, wherein the openings comprise holes having a diameter, or a maximum size of between 0.5 µm and 20 µm.

13. An interconnection device according to claim 1, wherein the openings comprise holes separated two by two by a distance of between 0.5 µm and 20 µm.

14. An interconnection device according to claim 2, wherein the openings comprise holes separated two by two by a distance of between 0.5 µm and 20 µm.

15. An interconnection device according to claim 3, wherein the openings comprise holes separated two by two by a distance of between 0.5 µm and 20 µm.

16. An interconnection device according to claim 1, wherein the electronic elements held at substantially equal potentials comprise high voltage elements.

* * * * *